United States Patent
Tang

(10) Patent No.: US 12,513,890 B2
(45) Date of Patent: Dec. 30, 2025

(54) MEMORY STRUCTURE AND MANUFACTURING METHOD THEREOF, AND SEMICONDUCTOR STRUCTURE

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 646 days.

(21) Appl. No.: 17/815,642

(22) Filed: Jul. 28, 2022

(65) Prior Publication Data

US 2023/0413520 A1 Dec. 21, 2023

(30) Foreign Application Priority Data

Jun. 21, 2022 (CN) .......................... 202210707061.6

(51) Int. Cl.
*H10B 12/00* (2023.01)

(52) U.S. Cl.
CPC ......... *H10B 12/315* (2023.02); *H10B 12/482* (2023.02); *H10B 12/488* (2023.02)

(58) Field of Classification Search
CPC .. H10B 12/315; H10B 12/482; H10B 12/488; H10B 12/05; H10B 12/03; H10B 12/30; H10B 12/01; H10B 12/312–485; H10D 1/60–716

See application file for complete search history.

(56) References Cited

U.S. PATENT DOCUMENTS

| | | | |
|---|---|---|---|
| 10,535,659 B2 * | 1/2020 | Kim | ........................ H10B 12/30 |
| 10,784,272 B2 | 9/2020 | Lee et al. | |
| 2022/0254784 A1 * | 8/2022 | Lee | ........................ H10B 12/02 |

FOREIGN PATENT DOCUMENTS

| | | |
|---|---|---|
| CN | 109616474 A | 4/2019 |
| CN | 109841630 A | 6/2019 |

\* cited by examiner

*Primary Examiner* — Shahed Ahmed

(74) *Attorney, Agent, or Firm* — Syncoda LLC; Feng Ma

(57) ABSTRACT

The present disclosure relates to a semiconductor structure, including a columnar epitaxial structure, a grounding structure, a bit line structure, a columnar capacitor structure, and a word line structure. The columnar epitaxial structure extends in a first direction; the grounding structure wraps one end of the columnar epitaxial structure; the bit line structure wraps the other end of the columnar epitaxial structure; the columnar capacitor structure surrounds the columnar epitaxial structure, and is located between the grounding structure and the bit line structure; and the word line structure surrounds the columnar epitaxial structure, and is located between the bit line structure and the columnar capacitor structure.

14 Claims, 8 Drawing Sheets

US 12,513,890 B2

MEMORY STRUCTURE AND MANUFACTURING METHOD THEREOF, AND SEMICONDUCTOR STRUCTURE

CROSS-REFERENCE TO RELATED APPLICATION

This application claims the priority of Chinese Patent Application No. 202210707061.6, submitted to the Chinese Intellectual Property Office on Jun. 21, 2022, the disclosure of which is incorporated herein in its entirety by reference.

TECHNICAL FIELD

The present disclosure relates to the technical field of integrated circuit design and manufacturing, and in particular, to a memory structure and a manufacturing method thereof, and a semiconductor structure.

BACKGROUND

With continuous development of integrated circuit manufacturing processes, the market puts forward higher requirements for performance and reliability of semiconductor products. For semiconductor memory devices, the performance of transistors built therein directly affects the storage performance and reliability of the products.

However, in conventional semiconductor memory devices, a floating body effect of transistors built therein will cause a kink effect, a parasitic bipolar transistor effect, an abnormal subthreshold slope, a device threshold voltage drift, etc. These effects not only reduce gains of the devices and cause unstable operation of the devices, but also reduce a drain breakdown voltage and cause a single-tube latch-up effect, resulting in a larger leakage current and an increase in power consumption.

SUMMARY

According to various embodiments of the present disclosure, a first aspect of the present disclosure provides a semiconductor structure, including a columnar epitaxial structure, a grounding structure, a bit line structure, a columnar capacitor structure, and a word line structure. The columnar epitaxial structure extends in a first direction; the grounding structure wraps one end of the columnar epitaxial structure; the bit line structure wraps the other end of the columnar epitaxial structure; the columnar capacitor structure surrounds the columnar epitaxial structure, and is located between the grounding structure and the bit line structure; and the word line structure surrounds the columnar epitaxial structure, and is located between the bit line structure and the columnar capacitor structure.

According to some embodiments, a second aspect of the present disclosure provides a memory structure, including: a substrate; and a plurality of target body structures formed on the substrate, extending in a second direction, and arranged at intervals in a third direction. Each of the plurality of target body structures includes a plurality of semiconductor structures arranged at intervals in the second direction, and the semiconductor structures are the semiconductor structure in any embodiment of the present disclosure. Word line structures in adjacent two of the semiconductor structures in the second direction insulate from each other. Bit line structures in adjacent two of the target body structures in the third direction insulate from each other. Every two of the first direction, the second direction, and the third direction are perpendicular to each other.

According to some embodiments, a third aspect of the present disclosure provides a method of manufacturing a memory structure, including: providing a substrate; and forming a plurality of target body structures, extending in a second direction and arranged at intervals in a third direction, on the substrate. Each of the plurality of target body structures includes a plurality of semiconductor structures arranged at intervals in the second direction, and the semiconductor structures are the semiconductor structure in any embodiment of the present disclosure. Word line structures in adjacent two of the semiconductor structures in the second direction insulate from each other. Bit line structures in adjacent two of the target body structures in the third direction insulate from each other. Every two of the first direction, the second direction, and the third direction are perpendicular to each other.

BRIEF DESCRIPTION OF THE DRAWINGS

To describe the technical solutions in the embodiments of the present application more clearly, the accompanying drawings required to describe the embodiments are briefly described below. Apparently, the accompanying drawings described below are only some embodiments of the present application. A person of ordinary skill in the art may further obtain accompanying drawings of other embodiments based on these accompanying drawings without creative efforts.

FIG. 4 to FIG. 6 are stereoscopic diagrams in different steps; FIG. 7 is a left view of FIG. 6; ox direction is a first direction; oz direction is a second direction; and oy direction is a third direction;

DETAILED DESCRIPTION

Figure 1:
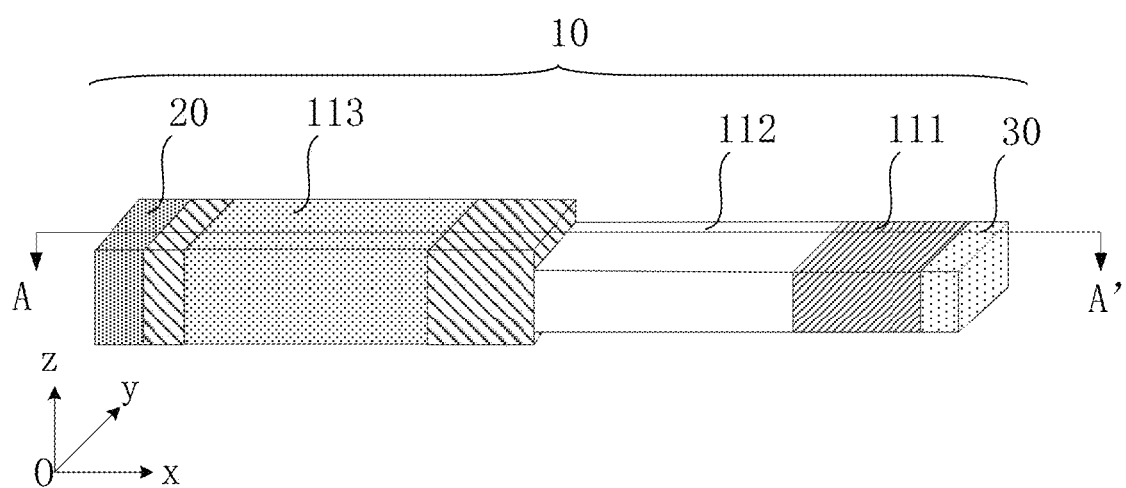
FIG. 1 is a stereoscopic diagram of a semiconductor structure according to one embodiment of the present disclosure.

To facilitate the understanding of the present application, the present application is described more completely below with reference to the accompanying drawings. Preferred embodiments of the present application are shown in the accompanying drawings. However, the present application may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present application. The terms used herein are merely for the purpose of describing specific embodiments, and are not intended to limit the present application.

It should be understood that when an element or a layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers. It should be understood that although terms such as first, second, and third may be used to describe various elements, components, regions, layers, doped types and/or sections, these elements, components, regions, layers, doped types and/or sections should not be limited by these terms. These terms are only used to distinguish one element, component, region, layer, doping type or section from another element, component, region, layer, doping type or section. Therefore, without departing from the teachings of the present application, a first element, component, region, layer, doping type or section discussed below may be a second element, component, region, layer, doping type or section. For example, the first doping type may be the second doping type, and similarly, the second doping type may be the first doping type; or the first doping type and the second doping type are different doping types, for example, the first doping type may be P-type and the second doping type may be N-type, or the first doping type may be N-type and the second doping type may be P-type.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over, an element or feature described as being "beneath another element", "below it", or "under it" is oriented as being "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

When used herein, the singular forms of "a", "an" and "the/this" may also include plural forms, unless clearly indicated otherwise. It should also be understood that terms "include" and/or "comprise", when used in this specification, may determine the presence of features, integers, steps, operations, elements and/or components, but do not exclude the presence or addition of one or more other features, integers, steps, operations, elements, components and/or groups. In this case, in this specification, the term "and/or" includes any and all combinations of related listed items.

It should be noted that the mutual insulation between the two described in the embodiments of the present disclosure includes, but is not limited to, the existence of one or more of an insulating material, an insulating air gap, or a gap between the two.

It should be noted that, the drawings provided in the embodiments merely illustrate the basic concepts of the present disclosure schematically. Although the drawings only show components related to the present disclosure rather than being drawn according to the quantities, shapes, and sizes of components in actual implementation, patterns, quantities, and proportions of components in actual implementation may be changed randomly, and the component layout may be more complex.

It should be noted that the "cross-sectional area" of the object described in the embodiments of the present disclosure is the area of the cross section perpendicular to the extension direction of the object.

A transistor forms a capacitor on an insulator layer, and charges accumulated on the capacitor may produce a negative effect. In conventional semiconductor memory devices, a floating body effect of transistors built therein will cause a kink effect, a parasitic bipolar transistor effect, an abnormal subthreshold slope, a device threshold voltage drift, etc. These effects not only reduce gains of the devices and cause unstable operation of the devices, but also reduce a drain breakdown voltage and cause a single-tube latch-up effect, resulting in a larger leakage current and an increase in power consumption.

For the above technical problems, the present disclosure provides a memory structure and a manufacturing method thereof, and a semiconductor structure, to solve the floating body effect of semiconductor transistors.

Figure 2A:
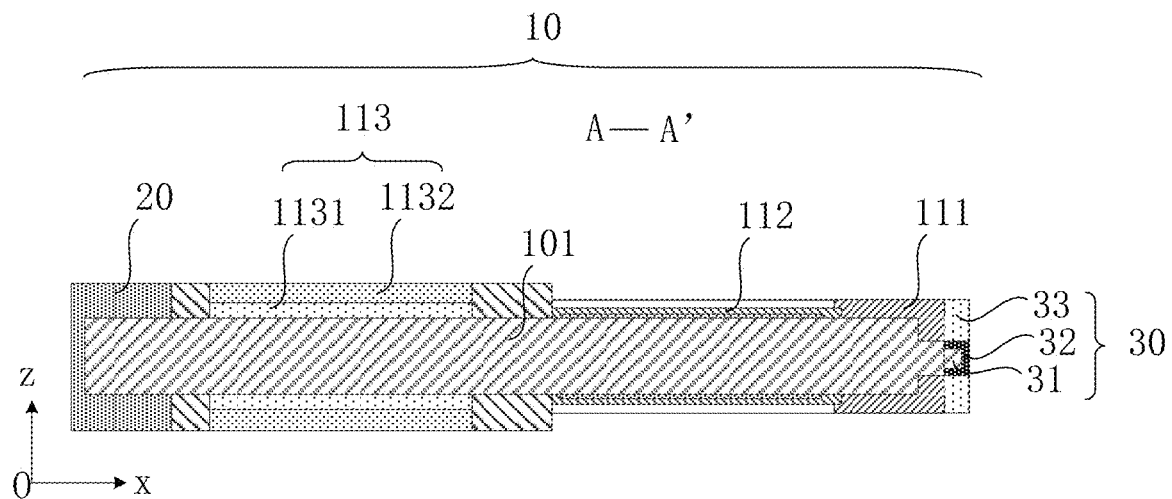
FIG. 2A is a schematic structural diagram of a cross section of a structure as shown in FIG. 1 along direction AA'.
Figure 2B:
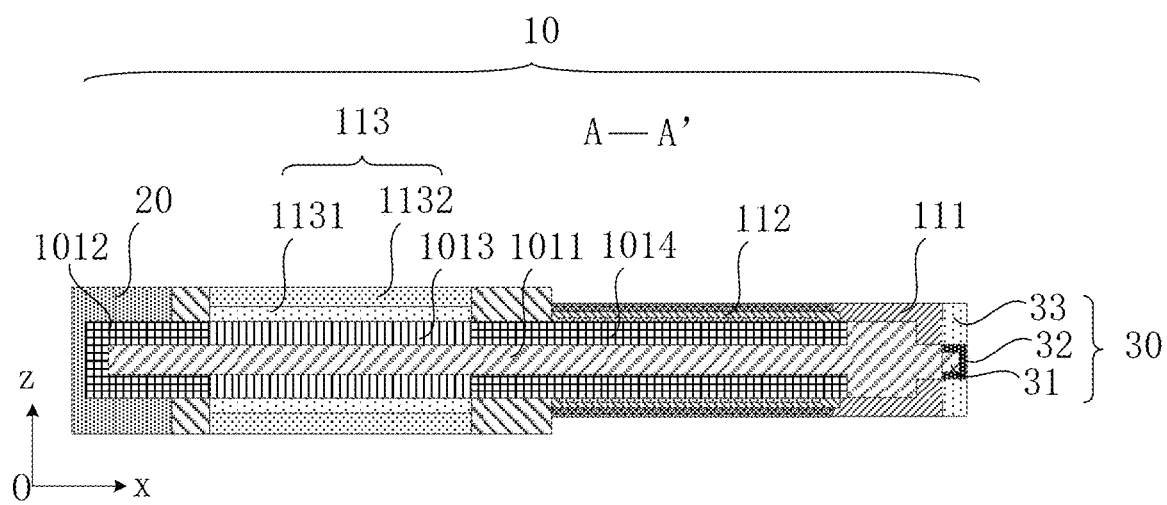
FIG. 2B is a schematic structural diagram of a cross section according to another embodiment of the present disclosure along direction AA'.

In some embodiments of the present disclosure, please referring to FIG. 1 and FIG. 2, a semiconductor structure 10 is provided. The semiconductor structure 10 includes a columnar epitaxial structure 101, a grounding structure 30, a bit line structure 20, a columnar capacitor structure 112, and a word line structure 113. The columnar epitaxial structure 101 extends in a first direction such as ox direction; the grounding structure 30 wraps one end of the columnar epitaxial structure 101; the bit line structure 20 wraps the other end of the columnar epitaxial structure 101; the columnar capacitor structure 112 surrounds the columnar epitaxial structure 101, and is located between the grounding structure 30 and the bit line structure 20; and the word line structure 113 surrounds the columnar epitaxial structure 101, and is located between the bit line structure 20 and the columnar capacitor structure 112. By arranging the grounding structure 30 on the columnar epitaxial structure 101, charges in the columnar epitaxial structure 101 flow away through the grounding structure 30, thereby avoiding the floating body effect, and improving the performance of semiconductor products.

In some embodiments, please still referring to FIG. 1 and FIG. 2, the semiconductor structure 10 further includes a capacitor isolation structure 111. The capacitor isolation structure 111 surrounds the columnar epitaxial structure 101, and is located between the grounding structure 30 and the columnar capacitor structure 112. A part of the columnar epitaxial structure 101 is wrapped by the capacitor isolation structure 111, and a cross-sectional area of an end, of the part of the columnar epitaxial structure 101 wrapped by the capacitor isolation structure 111, close to the grounding structure 30 is less than a cross-sectional area of the end of the columnar epitaxial structure 101 distant from the grounding structure 30. By arranging the capacitor isolation structure 111 on the columnar epitaxial structure 101, an enough distance is kept between the columnar capacitor structure 112 and the grounding structure 30 to achieve good electrical isolation. Moreover, the cross-sectional area of the columnar epitaxial structure 101 and a ground connection portion is less than the cross-sectional area of the columnar epitaxial structure 101 distant from the ground connection portion, such that a parasitic capacitance effect can be effectively reduced.

In some embodiments, please still referring to FIG. 1 and FIG. 2, a cross-sectional area of the part of the columnar epitaxial structure 101 wrapped by the grounding structure 30 is less than a cross-sectional area of the part of the columnar epitaxial structure 101 wrapped by the columnar capacitor structure 112. The grounding structure 30 includes a conductive contact layer 32 and a grounding pad 33 sequentially stacked from inside to outside, where the conductive contact layer 32 wraps the end of the columnar epitaxial structure 101 distant from the bit line structure 20. By arranging the conductive contact layer 32 between the columnar epitaxial structure 101 and the grounding pad 33, the columnar epitaxial structure 101 and the grounding pad 33 are in good electrical contact, such that the grounding resistance is reduced, and it can better ensure that the charges in the columnar epitaxial structure 101 flow away through the grounding structure 30, thereby improving the performance of the semiconductor products.

In some embodiments, please still referring to FIG. 1 and FIG. 2, a sum of lengths of the parts of the columnar epitaxial structure 101 wrapped by the grounding structure 30 and the capacitor isolation structure 111 is [10 nm, 100 nm]. For example, the sum of lengths of the parts of the columnar epitaxial structure 101 wrapped by the grounding structure 30 and the capacitor isolation structure 111 may be 10 nm, 30 nm, 50 nm, 80 nm, or 100 nm, etc. If conditions permit, a relatively large value may be selected to make an electrical distance between the columnar capacitor structure 112 and the grounding structure 30 larger to prevent mutual interference.

In some embodiments, please still referring to FIG. 1 and FIG. 2, the cross section of the part of the columnar epitaxial structure 101 wrapped by the grounding structure 30 is square, and the edge length may be [1 nm, 20 nm]. For example, the edge length of the cross section of the part of the columnar epitaxial structure 101 wrapped by the grounding structure 30 may be 1 nm, 5 nm, 10 nm, 15 nm, or 20 nm, etc. on the premise of ensuring structural strength of the columnar epitaxial structure 101, a relatively small value may be selected to reduce interference between the columnar capacitor structure 112 and the grounding structure 30.

In some embodiments, please still referring to FIG. 1 and FIG. 2, the conductive contact layer 32 may be made of, but not limited to, a metal conductive material. The grounding pad 33 is made of a metal conductive material and/or a non-metal conductive material. The metal conductive material may include, but is not limited to, one or more of cobalt (Co), nickel (Ni), titanium (Ti), tungsten (W), tantalum (Ta), palladium (Pd), ruthenium (Ru), platinum (Pt), tantalum titanium (TaTi), tungsten nitride (WN), copper (Cu), and aluminum (Al). The non-metal conductive material includes, but is not limited to, doped polycrystalline silicon.

In some embodiments, please still referring to FIG. 1 and FIG. 2, the word line structure 113 includes a gate oxide layer 1131 and a gate metal layer 1132 sequentially stacked from inside to outside; the gate oxide layer 1131 surrounds the columnar epitaxial structure 101; and the gate metal layer 1132 surrounds the gate oxide layer 1131. A cross section of the part of the columnar epitaxial structure 101 surrounded by the gate oxide layer 1131 is square, with an edge length of [30 nm, 100 nm]. The word line structure 113 is arranged around the columnar epitaxial structure 101 in a symmetric structure, facilitating improving the stability of the word line structure 113. The edge length of the cross section of the part of the columnar epitaxial structure 101 surrounded by the gate oxide layer 1131 may be 30 nm, 50 nm, 70 nm, 90 nm, or 100 nm, etc. This embodiment avoids mutual contact between adjacent two of the word line structures 113 in the stacking direction while ensuring the electrical performance of the word line structures 113.

In some embodiments, please still referring to FIG. 1 and FIG. 2, an outer boundary of a cross section of the gate oxide layer 1131 may be square, and the gate oxide layer 1131 has a thickness of [4.5 nm, 8 nm]. For example, the thickness of the gate oxide layer 1131 may be 4.5 nm, 5.5 nm, 6.5 nm, 7.5 nm, or 8 nm, etc. On the one hand, the gate control is ensured; and on the other hand, the gate leakage current can be reduced, and the gate breakdown voltage can be increased. The gate oxide layer 1131 may be made of a material with a high-k dielectric constant. For example, the material of the gate oxide layer 1131 may include, but is not limited to, one or more of aluminum oxide ($Al_2O_3$), hafnium oxide ($HfO_2$), hafnium oxynitride (HfON), zirconium oxide ($ZrO_2$), tantalum oxide ($Ta_2O_5$), titanium oxide ($TiO_2$), or strontium titanium oxide material ($SrTiO_3$), etc.

In some embodiments, please still referring to FIG. 1 and FIG. 2, an outer boundary of a cross section of the gate metal layer 1132 may be square, and the gate metal layer 1132 has a thickness of [4 nm, 10 nm]. For example, the thickness of the gate metal layer 1132 may be 4 nm, 5 nm, 6 nm, 8 nm, 9 nm, or 10 nm, etc. On the one hand, the gate voltage of the semiconductor transistor is balanced; and on the other hand, word line coupling due to a close distance between top and bottom gates is avoided. The gate metal layer 1132 may include, but is not limited to, any one or several of titanium nitride (TiN), titanium (Ti), tungsten silicide ($Si_2W$), and tungsten (W), etc.

In some embodiments, please still referring to FIG. 1 and FIG. 2, the columnar epitaxial structure 101 includes a conductive pillar 1011, a source-region conductive layer 1012, a channel-region conductive layer 1013, and a drain-region conductive layer 1014. The conductive pillar 1011 extends in the first direction such as ox direction, and may be doped with a first type, such as P-type light doping. The source-region conductive layer 1012 wraps one end of the conductive pillar 1011, is located between the bit line structure 20 and the conductive pillar 1011, and may be doped with a second type, such as N-type heavy doping, for forming a source region of the transistor. The channel-region conductive layer 1013 surrounds the conductive pillar 1011, is located between the gate oxide layer 1131 and the conductive pillar 1011, and may be doped with the first type, such as P-type heavy doping, for forming a channel region of the transistor. The drain-region conductive layer 1014 surrounds the conductive pillar 1011, is located between the columnar capacitor structure 112 and the conductive pillar 1011, and may be doped with the second type, such as N-type heavy doping, for forming a drain region of the transistor. P-type impurity ions may include, but are not limited to, one or several of boron (B) ions, gallium (Ga) ions, boron fluoride ($BF_2$) ions, and indium (In) ions, etc. N-type impurity ions may include, but are not limited to, one or several of phosphorus (P) ions, arsenic (As) ions, and antimony (Sb) ions, etc. The conductive pillar 1011 is equivalent to a grounding wire, and the channel region may be directly connected to a ground terminal through the conductive pillar 1011 for providing a release path for accumulated charges.

In some embodiments, please referring to FIG. 3 to FIG. 7, the present disclosure provides a method of manufacturing a memory structure, including:

Step S22: provide a substrate 100.

Step S24: form a plurality of target body structures 11, extending in a second direction such as oz direction and arranged at intervals in a third direction such as oy direction, on the substrate 100.

Each of the plurality of target body structures 11 includes a plurality of semiconductor structures 10 arranged at intervals in the oz direction; word line structures 113 in adjacent two of the semiconductor structures 10 in the oz direction insulate from each other; bit line structures 20 in adjacent two of the target body structures 11 in the oy direction insulate from each other; and every two of the ox direction, the oy direction, and the oz direction are perpendicular to each other.

Figure 4:
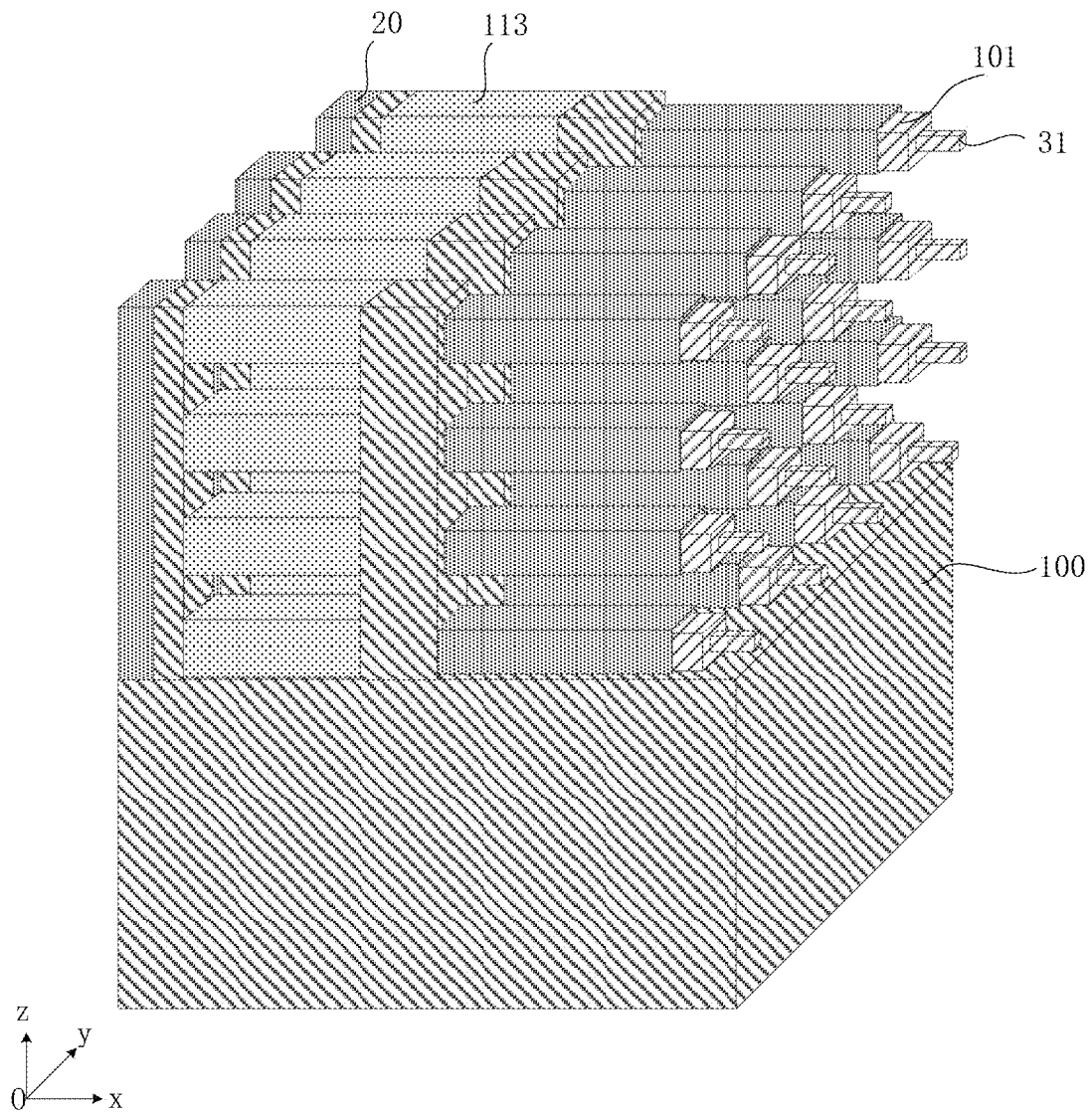
FIG. 4 to FIG. 7 are schematic structural diagrams of different steps in a method of manufacturing a memory structure according to one embodiment of the present disclosure, where

In some embodiments, please still referring to FIG. 4, the substrate 100 is provided; and the substrate 100 may be made of a semiconductor material, an insulating material, a conductor material, or any combination thereof. The substrate 100 may be of a single-layer structure or a multi-layer structure. For example, the substrate may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an indium arsenide (InAs) substrate, an indium phosphide (InP) substrate, or another III/V semiconductor substrate or II/VI semiconductor substrate. Alternatively, also for example, the substrate may be a layered substrate including, for example, Si/SiGe, Si/SiC, silicon-on-insulator (SOI), or silicon-germanium-on-insulator. Therefore, the material type of the substrate 100 should not limit the protection scope of the present disclosure. The P-type ions may be implanted into the substrate 100 by using an ion implantation process to form a first-type doped well region (not shown in the drawing). The P-type ions may include, but are not limited to, one or several of boron (B) ions, gallium (Ga) ions, boron fluoride ($BF_2$) ions, and indium (In) ions, etc. The doping concentration of the first-type doped well region in the substrate 100 may be [1E12 cm-3, 1E18 cm-3]. For example, the doping concentration of the first-type doped well region may be 1E12 cm-3, 1E13 cm-3, 1E14 cm-3, 1E15 cm-3, 1E16 cm-3, 1E17 cm-3, or 1E18 cm-3, etc.

In some embodiments, please still referring to FIG. 4 to FIG. 8, the forming a plurality of target body structures 11, extending in the oz direction and arranged at intervals in the oy direction, on the substrate 100 in step S24 includes:

Step S242: etch the end of the columnar epitaxial structure 101 distant from the bit line structure 20 in the first direction such as ox direction, and form an interconnection structure 31, a cross-sectional area of the interconnection structure 31 being less than a cross-sectional area of the part of the columnar epitaxial structure 101 wrapped by the columnar capacitor structure 112, where a cross section being perpendicular to the ox direction.

Step S244: siliconize an end of the interconnection structure 31 distant from the bit line structure 20 in the first direction such as ox direction, and form a conductive contact layer 32.

In some embodiments, please still referring to FIG. 4, in step S242, the end of the columnar epitaxial structure 101 distant from the bit line structure 20 in the ox direction may be removed by using a wet etching process, to form the interconnection structure 31. The concentration, flow or etching time of an etching solution may be adjusted. The etching solution, for example, includes, but is not limited to, a single solution or multiple mixed solutions of phosphoric acid, diluted hydrofluoric acid, diluted sulfuric acid, carbon tetrafluoride ($CF_4$), or sulfur hexafluoride ($SF_6$). The cross-sectional area of the interconnection structure 31 is less than the cross-sectional area of the part of the columnar epitaxial structure 101 wrapped by the columnar capacitor structure 112, and on the premise of ensuring structural strength, the cross-sectional area of the interconnection structure 31 is reduced as much as possible, so as to reduce mutual interference between the columnar capacitor structure 112 and the grounding structure 30.

Figure 5:
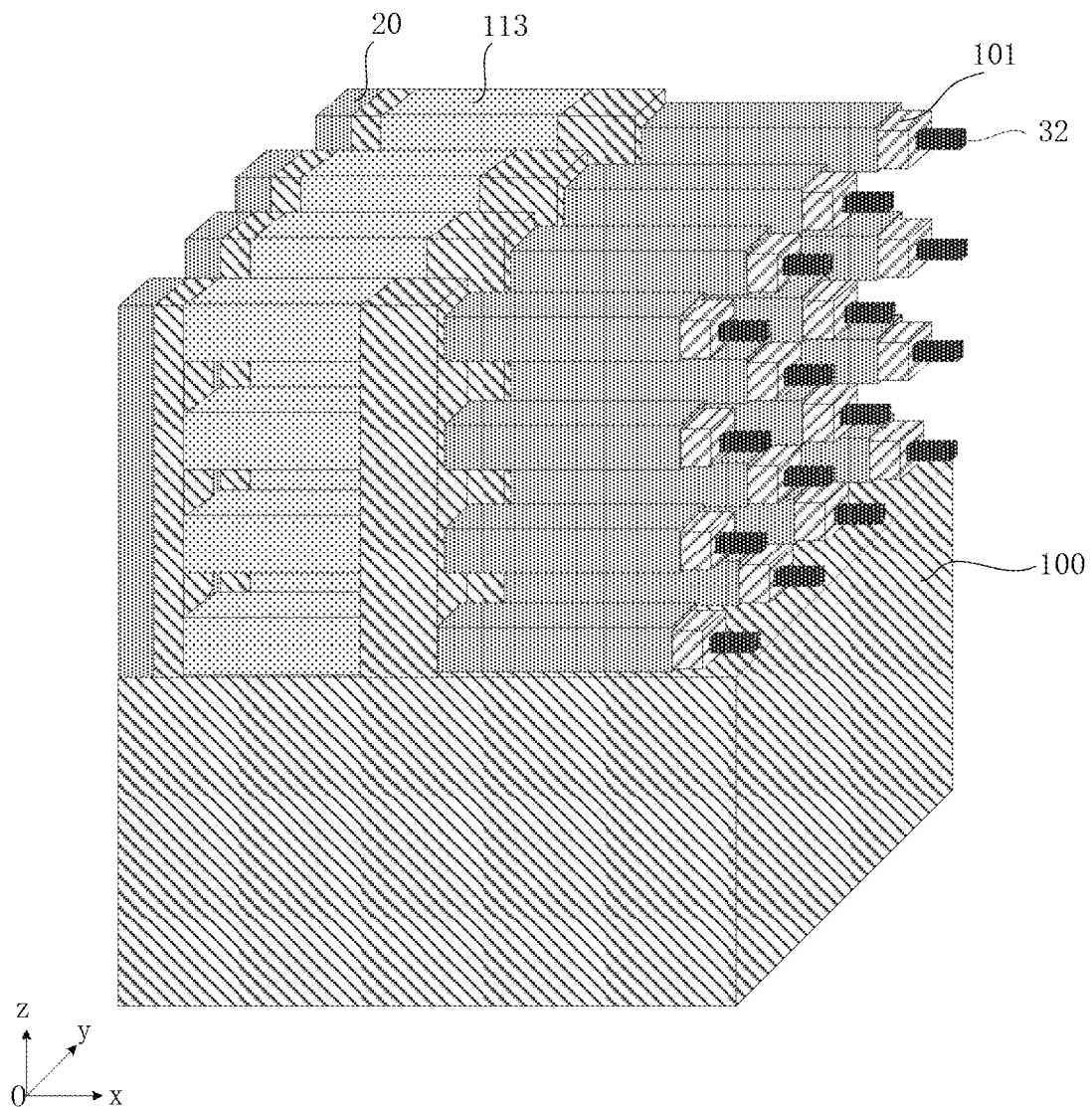

In some embodiments, please still referring to FIG. 5, in step S244, the conductive contact layer 32 is formed by depositing a layer of metal conductive material by silicidation at one end of the interconnection structure 31 distant from the bit line structure 20 in the ox direction. For example, the specific process may be: first, depositing an oxide layer on the surface of the columnar epitaxial structure 101 to protect the internal columnar capacitor structure 112 and expose the interconnection structure 31; secondly, depositing metal conductive layers on the surface of the oxide layer and the surface of the interconnection structure 31 by silicidation, where the material of the metal conductive layers includes, but is not limited to, one or more of cobalt (Co), nickel (Ni), titanium (Ti), tungsten (W), tantalum (Ta), palladium (Pd), ruthenium (Ru), platinum (Pt), tantalum titanium (TaTi), tungsten nitride (WN), copper (Cu), and aluminum (Al); next, performing annealing treatment; and then, etching the metal conductive layer and the oxide layer that wrap the surface of the columnar capacitor structure 112, and retaining the metal conductive layer on the surface of the interconnection structure 31 to form the conductive contact layer 32. The etching process may include, but is not limited to, one or more of reactive ion etching (RIE), inductively coupled plasma (ICP) etching, or high-concentration plasma (HDP) etching. The deposition process may include, but is not limited to, one or more of a chemical vapor deposition (CVD), an atomic layer deposition (ALD) process, a high-density plasma (HDP) process, a plasma enhanced deposition process, and a spin-on dielectric (SOD) layer process.

Figure 6:
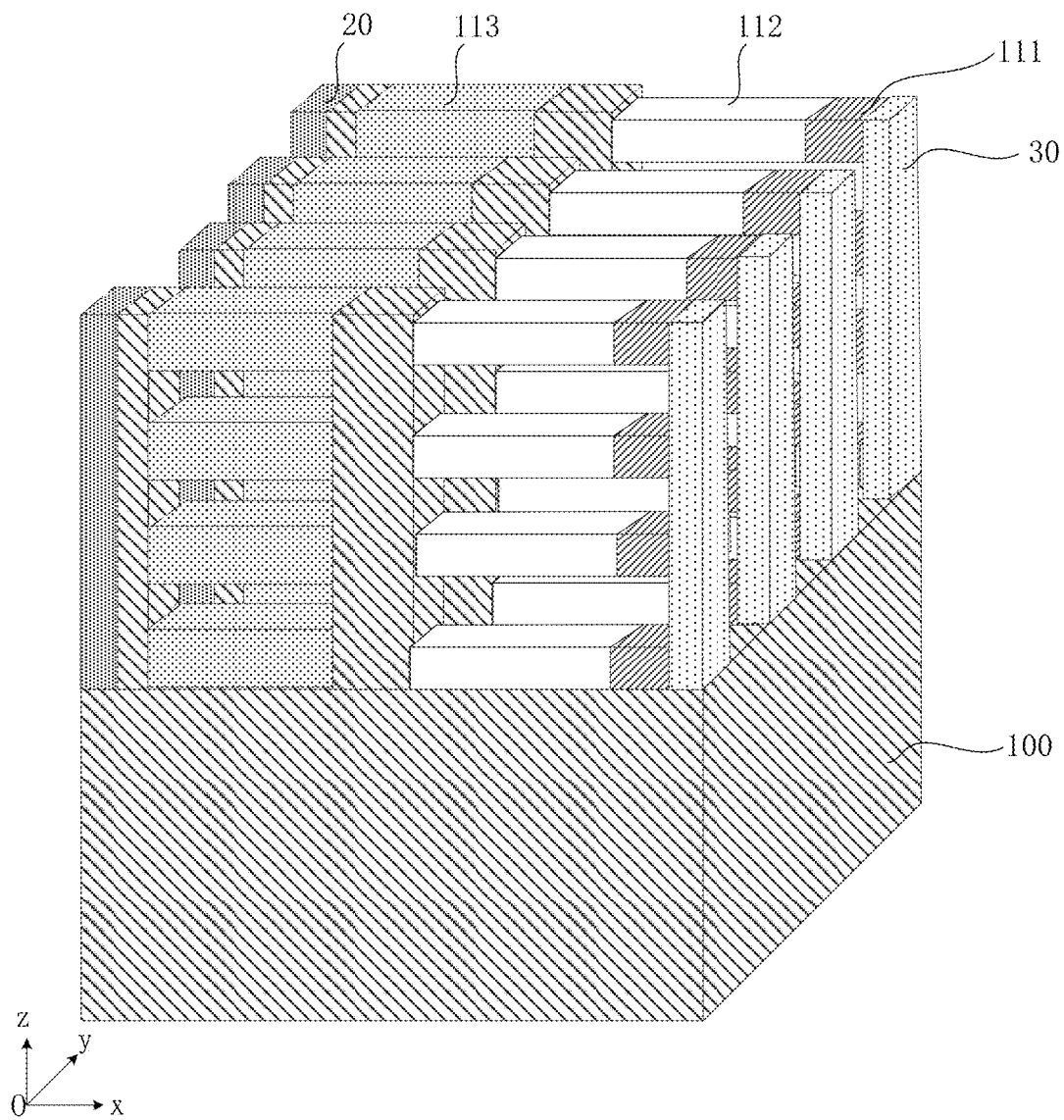
Figure 9:
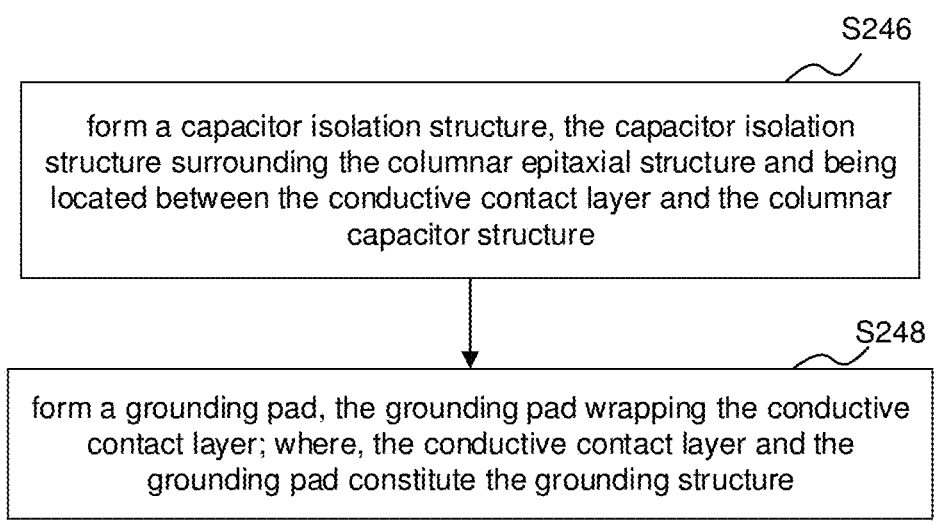
FIG. 9 is a supplemental flowchart of a method of manufacturing a memory structure according to one embodiment of the present disclosure.

In some embodiments, please still referring to FIG. 6 and FIG. 9, after the conductive contact layer 32 is formed in step S244, the manufacturing method further includes:

S246, form a capacitor isolation structure 111, the capacitor isolation structure 111 surrounding the columnar epitaxial structure 101 and being located between the conductive contact layer 32 and the columnar capacitor structure 112.

S248, form a grounding pad 33, the grounding pad 33 wrapping the conductive contact layer 32; where, the conductive contact layer 32 and the grounding pad 33 constitute the grounding structure 30.

In FIG. 6, two adjacent ones of the grounding structures 30 in the second direction such as oz direction are electrically connected to each other; and two adjacent ones of the grounding structures 30 in the third direction such as oy direction insulate from each other.

In some embodiments, please still referring to FIG. 6, in step S246, the capacitor isolation structure 111 may be formed on the columnar capacitor structure 112 between the conductive contact layer 32 and the columnar capacitor structure 112 by using the deposition process. The longer the length of the capacitor isolation structure 111 in the ox direction, the better the isolation effect, and the more it can ensure that no electrical interference occurs between the columnar capacitor structure 112 and the grounding structure 30. The capacitor isolation structure 111 may be made of a material with a low-K dielectric constant. For example, the material of the capacitor isolation structure 111 includes, but is not limited to, one or more of fluorine-doped silica (SiOF), carbon-doped silica (SiOC), and an organic polymer, or a porous material.

In some embodiments, please still referring to FIG. 6, in step S248, the grounding pad 33 may be deposited on the outer surface of the conductive contact layer 32 by using the deposition process. The grounding pad 33 may be made of a metal conductive material and/or a non-metal conductive material. The metal conductive material includes, but is not limited to, one or more of cobalt (Co), nickel (Ni), titanium (Ti), tungsten (W), tantalum (Ta), palladium (Pd), ruthenium (Ru), platinum (Pt), tantalum titanium (TaTi), tungsten nitride (WN), titanium nitride (TiN), copper (Cu), and aluminum (Al). The non-metal conductive material includes, but is not limited to, doped polycrystalline silicon. The conductive contact layer 32 and the grounding pad 33 jointly constitute the grounding structure 30. Adjacent two of the grounding structures 30 in the oz direction are kept in electrical connection, such that the semiconductor transistors are commonly grounded in the oz direction, it is beneficial to reduce interference between conductive structures in the oz direction, and the performance of the semiconductor transistors is improved.

Figure 7:
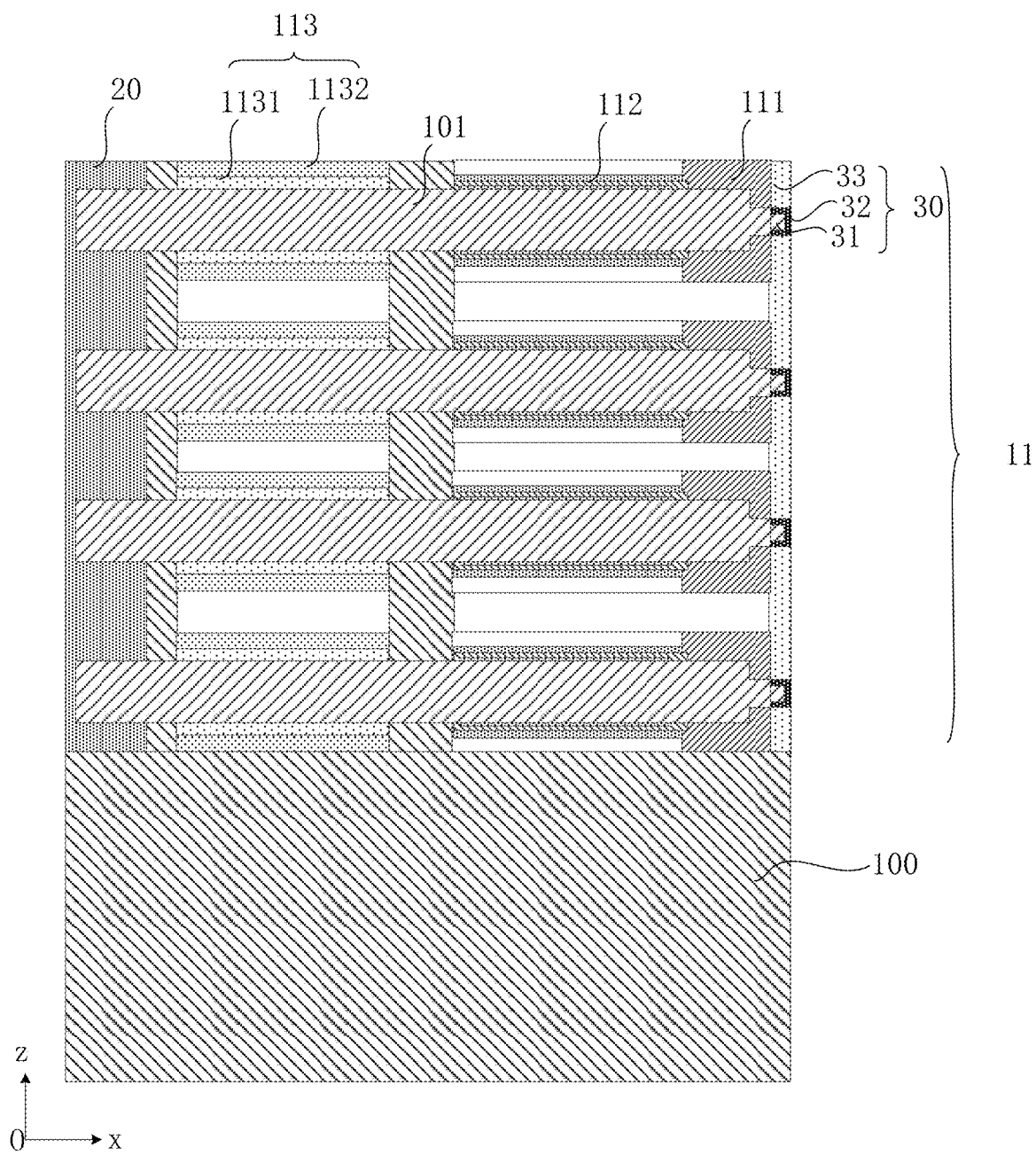
Figure 8:
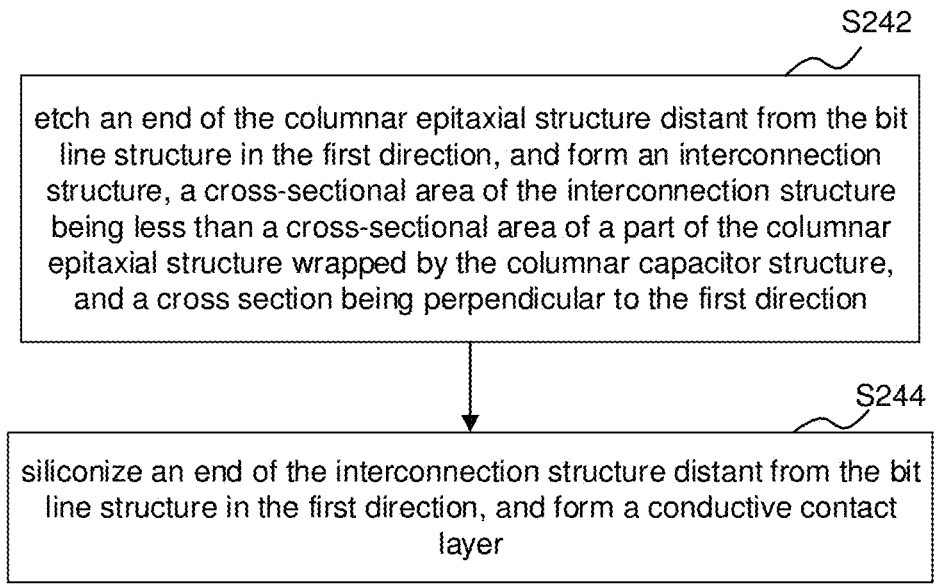
FIG. 8 is a supplemental flowchart of a method of manufacturing a memory structure according to one embodiment of the present disclosure.
Figure 10:
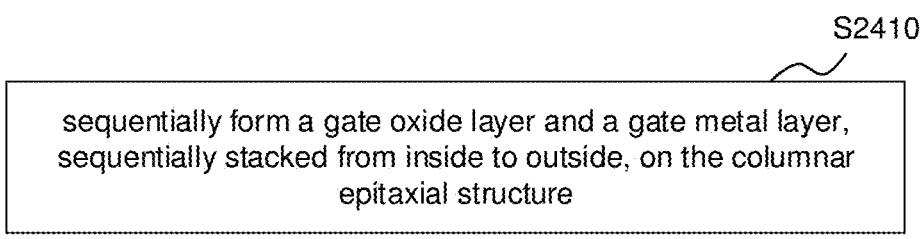
FIG. 10 is a supplemental flowchart of a method of manufacturing a memory structure according to one embodiment of the present disclosure.

In some embodiments, please still referring to FIG. 7 and FIG. 10, the forming a plurality of target body structures 11, extending in the second direction such as oz direction and arranged at intervals in the third direction such as oy direction, on the substrate 100 in step S24 includes:

Step S2410: sequentially form a gate oxide layer 1131 and a gate metal layer 1132, sequentially stacked from inside to outside, on the columnar epitaxial structure 101.

As an example, please still referring to FIG. 7, the gate oxide layer 1131 surrounds the columnar epitaxial structure 101; and the gate metal layer 1132 surrounds the gate oxide layer 1131. The cross section of the part of the columnar epitaxial structure 101 surrounded by the gate oxide layer 1131 is square, with an edge length of [30 nm, 100 nm], and the cross section is perpendicular to the ox direction; and/or, the outer boundary of the cross section of the gate oxide layer 1131 is square, and the gate oxide layer 1131 has a thickness of [4.5 nm, 8 nm]; and/or, the outer boundary of the cross section of the gate metal layer 1132 is square, and the gate metal layer 1132 has a thickness of [4 nm, 10 nm].

In some embodiments, please still referring to FIG. 7, in step S2410, the gate oxide layer 1131 may be formed on the columnar epitaxial structure 101 by using an atomic layer deposition process, a plasma vapor deposition process, or a rapid thermal oxidation (RTO) process, and then the gate metal layer 1132 is deposited on the outer surface of the gate oxide layer 1131 by using the deposition process to form the word line structure 113. The gate oxide layer 1131 surrounds the columnar epitaxial structure 101; and the gate metal layer 1132 surrounds the gate oxide layer 1131. In a direction perpendicular to the upper surface of the substrate 100, such as the oz direction, adjacent two of the word line structures 113 insulate from each other, so as to subsequently select a required word line. In the oy direction, adjacent two of the word line structures 113 are in ohmic contact or integrally molded. The gate oxide layer 1131 may be made of a material with a high-k dielectric constant. For example, the material of the gate oxide layer 1131 may include, but is not limited to, one or more of aluminum oxide ($Al_2O_3$), hafnium oxide ($HfO_2$), hafnium oxide nitrogen (HfON), zirconium oxide ($ZrO_2$), tantalum oxide ($Ta_2O_5$), titanium oxide ($TiO_2$), or strontium titanium oxide ($SrTiO_3$). The gate metal layer 1132 may include, but is not limited to, any one or several of titanium nitride (TiN), titanium (Ti), tungsten silicide ($Si_2W$), and tungsten (W), etc. The cross section of the part of the columnar epitaxial structure 101 surrounded by the gate oxide layer 1131 is square, with an edge length of [30 nm, 100 nm]. For example, the edge length of the cross section of the part of the columnar epitaxial structure 101 surrounded by the gate oxide layer 1131 may be 30 nm, 50 nm, 70 nm, 90 nm, or 100 nm, etc. To ensure the gate control, and reduce the gate leakage and increase the gate breakdown voltage, the outer boundary of the cross section of the gate oxide layer 1131 is square, and the gate oxide layer 1131 has a thickness of [4.5 nm, 8 nm]. For example, the thickness of the gate oxide layer 1131 may be 4.5 nm, 5.5 nm, 6.5 nm, 7.5 nm, or 8 nm, etc. To ensure the balance of the gate voltage of the semiconductor transistor and avoid word line coupling due to a close distance between the top and bottom gates, the outer boundary of the cross section of the gate metal layer 1132 is square, and the gate metal layer 1132 has a thickness of [4 nm, 10 nm]. For example, the thickness of the gate metal layer 1132 may be 4 nm, 5 nm, 6 nm, 8 nm, 9 nm, or 10 nm, etc.

Figure 3:
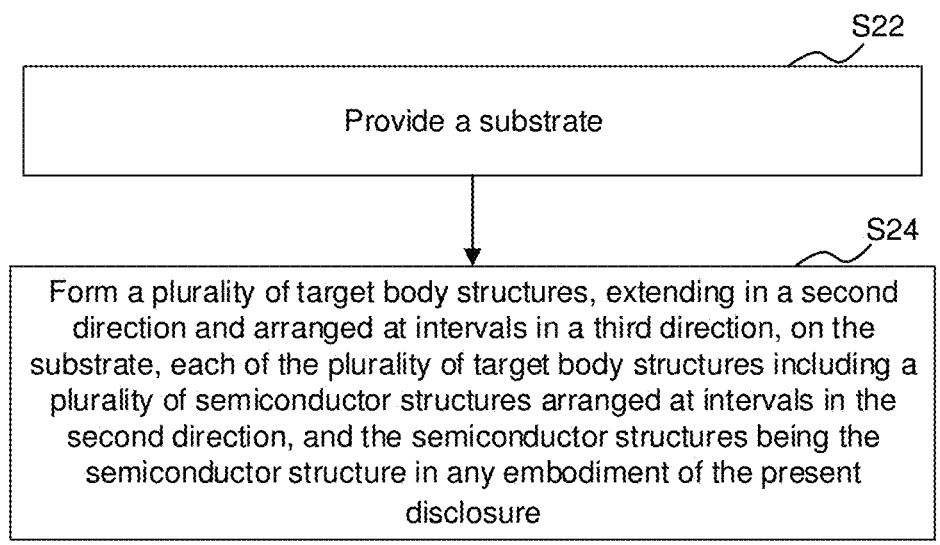
FIG. 3 is a schematic flowchart of a method of manufacturing a memory structure according to one embodiment of the present disclosure.

It should be understood that although the steps in the flowchart of FIG. 3 are sequentially displayed according to the arrows, these steps are not necessarily executed in the order indicated by the arrows. Unless clearly described otherwise, the execution order of the steps is not strictly limited, and these steps may be executed in other orders. Moreover, at least some of the steps in FIG. 3 may include a plurality of sub-steps or stages. The sub-steps or stages are not necessarily executed at the same time, but may be executed at different times. The sub-steps or stages are not necessarily carried out sequentially, but may be executed alternately with other steps or at least some of sub-steps or stages of other steps.

In some embodiments of the present disclosure, please still referring to FIG. 1, FIG. 6, and FIG. 7, a memory structure is provided. The memory structure includes: a substrate 100; and a plurality of target body structures 11 formed on the substrate 100, extending in a second direction such as oz direction, and arranged at intervals in a third direction such as oy direction. Each of the plurality of target body structures 11 includes a plurality of semiconductor structures 10 arranged at intervals in the oz direction. Word line structures 113 in adjacent two of the semiconductor structures 10 in the oz direction insulate from each other. Bit line structures 20 in adjacent two of the target body structures 11 in the oy direction insulate from each other. Every two of the ox direction, the oy direction, and the oz direction are perpendicular to each other. By arranging the grounding structure 30 on the columnar epitaxial structure 101, charges in the columnar epitaxial structure 101 flow away through the grounding structure 30, thereby avoiding the floating body effect, and improving the performance of semiconductor products.

As an example, please still referring to FIG. 6 and FIG. 7, the semiconductor structure 10 further includes a capacitor isolation structure 111. The capacitor isolation structure 111 surrounds the columnar epitaxial structure 101, and is located between the grounding structure 30 and the columnar capacitor structure 112. A part of the columnar epitaxial structure 101 is wrapped by the capacitor isolation structure 111, and the cross-sectional area of the end of the columnar epitaxial structure 101 close to the grounding structure 30 is less than the cross-sectional area of the end of the columnar epitaxial structure 101 distant from the grounding structure 30. By arranging the capacitor isolation structure 111 on the columnar epitaxial structure 101, an enough electrical distance is kept between the columnar capacitor structure 112 and the grounding structure 30 to achieve good electrical isolation. Moreover, the cross-sectional area of the columnar epitaxial structure 101 and the ground connection portion is less than the cross-sectional area of the columnar epitaxial structure 101 distant from the ground connection portion, such that the parasitic capacitance effect can be effectively reduced.

As an example, please still referring to FIG. 6 and FIG. 7, the cross-sectional area of the part of the columnar epitaxial structure 101 wrapped by the grounding structure 30 is less than the cross-sectional area of the part of the columnar epitaxial structure 101 wrapped by the columnar capacitor structure 112. The grounding structure 30 includes a conductive contact layer 32 and a grounding pad 33 sequentially stacked from inside to outside, where the conductive contact layer 32 wraps the end of the columnar epitaxial structure 101 distant from the bit line structure 20. By arranging the conductive contact layer 32 between the columnar epitaxial structure 101 and the grounding pad 33, the columnar epitaxial structure 101 and the grounding pad 33 are in good electrical contact, such that the grounding resistance is reduced, and it can better ensure that the charges in the columnar epitaxial structure 101 flow away through the grounding structure 30, thereby improving the performance of the semiconductor products.

In some embodiments, please still referring to FIG. 7, the conductive contact layer 32 may be made of, but not limited to, a metal conductive material. The grounding pad 33 is made of a metal conductive material and/or a non-metal conductive material. The metal conductive material may include, but is not limited to, one or more of cobalt (Co), nickel (Ni), titanium (Ti), tungsten (W), tantalum (Ta), palladium (Pd), ruthenium (Ru), platinum (Pt), tantalum titanium (TaTi), tungsten nitride (WN), copper (Cu), and aluminum (Al). The non-metal conductive material includes, but is not limited to, doped polycrystalline silicon.

In some embodiments, please still referring to FIG. 7, the word line structure 113 includes a gate oxide layer 1131 and a gate metal layer 1132 sequentially stacked from inside to outside; the gate oxide layer 1131 surrounds the columnar epitaxial structure 101; and the gate metal layer 1132 surrounds the gate oxide layer 1131. A cross section of the part of the columnar epitaxial structure 101 surrounded by the gate oxide layer 1131 is square, with an edge length of [30 nm, 100 nm]. The word line structure 113 is arranged around the columnar epitaxial structure 101 in a symmetric structure, facilitating improving the stability of the word line structure 113. The edge length of the cross section of the part of the columnar epitaxial structure 101 surrounded by the gate oxide layer 1131 may be 30 nm, 50 nm, 70 nm, 90 nm, or 100 nm, etc. This embodiment avoids mutual contact between adjacent two of the word line structures 113 in the stacking direction while ensuring the electrical performance of the word line structures 113.

In some embodiments, please still referring to FIG. 7, the semiconductor structure 10 further includes a bit line isolation structure and a word line isolation structure. The bit line isolation structure is located between the bit line structure 20 and the word line structure 113, and surrounds the columnar epitaxial structure 101, such that the bit line structure 20 and the word line structure 113 are electrically isolated in the ox direction. The material of the bit line isolation structure may include, but is not limited to, a silicon oxide ($SiO_2$) layer, a silicon nitride ($Si_3N_4$) layer, and an aluminum oxide ($Al_2O_3$) or silicon oxynitride (SiON) layer, etc. The bit line isolation structure may be formed through a chemical vapor deposition method. The chemical vapor deposition method may specifically include an atomic layer deposition (ALD) method and/or a plasma enhanced vapor deposition (PECVD) method, etc. The word line isolation structure is located between the word line structure 113 and the columnar capacitor structure 112, and surrounds the columnar epitaxial structure 101, such that the word line structure 113 and the columnar capacitor structure 112 are electrically isolated in the ox direction. The material of the word line isolation structure may include, but is not limited to, a silicon oxide ($SiO_2$) layer, a silicon nitride ($Si_3N_4$) layer, and an aluminum oxide ($Al_2O_3$) or silicon oxynitride (SiON) layer, etc. The word line isolation structure may be formed through a chemical vapor deposition method. The chemical vapor deposition method may specifically include the ALD method and/or the PECVD method, etc.

The technical features of the above embodiments can be employed in arbitrary combinations. To provide a concise description, all possible combinations of all technical features of the above embodiments may not be described; however, these combinations of technical features should be construed as disclosed in this specification as long as no contradiction occurs.

The foregoing embodiments are intended to illustrate several implementations of the present application in detail, and they should not be construed as a limitation to the patentable scope of the present application. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A semiconductor structure, comprising:
   a columnar epitaxial structure, extending in a first direction;
   a grounding structure, wrapping one end of the columnar epitaxial structure;
   a bit line structure, wrapping the other end of the columnar epitaxial structure;
   a columnar capacitor structure, surrounding the columnar epitaxial structure and located between the grounding structure and the bit line structure; and
   a word line structure, surrounding the columnar epitaxial structure and located between the bit line structure and the columnar capacitor structure;
   a capacitor isolation structure, surrounding the columnar epitaxial structure and located between the grounding structure and the columnar capacitor structure,
   wherein a part of the columnar epitaxial structure is wrapped by the capacitor isolation structure, and a cross-sectional area of an end of the columnar epitaxial structure close to the grounding structure is less than a cross-sectional area of an end of the columnar epitaxial structure distant from the grounding structure.

2. The semiconductor structure according to claim 1, wherein a cross-sectional area of a part of the columnar epitaxial structure wrapped by the grounding structure is less than a cross-sectional area of a part of the columnar epitaxial structure wrapped by the columnar capacitor structure; and the grounding structure comprises a conductive contact layer and a grounding pad sequentially stacked from inside to outside;

wherein, the conductive contact layer wraps an end of the columnar epitaxial structure distant from the bit line structure.

3. The semiconductor structure according to claim 2, wherein a sum of lengths of parts of the columnar epitaxial structure wrapped by the grounding structure and the capacitor isolation structure is [10 nm, 100 nm].

4. The semiconductor structure according to claim 2, wherein a cross section of the part of the columnar epitaxial structure wrapped by the grounding structure is square, with an edge length of [1 nm, 20 nm].

5. The semiconductor structure according to claim 2, wherein the conductive contact layer is made of a metal conductive material; and the grounding pad is made of a metal conductive material and/or a non-metal conductive material.

6. The semiconductor structure according to claim 1, wherein the word line structure comprises a gate oxide layer and a gate metal layer sequentially stacked from inside to outside;

the gate oxide layer surrounds the columnar epitaxial structure; the gate metal layer surrounds the gate oxide layer; and a cross section of a part of the columnar epitaxial structure surrounded by the gate oxide layer is square, with an edge length of [30 nm, 100 nm].

7. The semiconductor structure according to claim 6, wherein an outer boundary of a cross section of the gate oxide layer is square, and the gate oxide layer has a thickness of [4.5 nm, 8 nm].

8. The semiconductor structure according to claim 6, wherein an outer boundary of a cross section of the gate metal layer is square, and the gate metal layer has a thickness of [4 nm, 10 nm].

9. The semiconductor structure according to claim 6, wherein the columnar epitaxial structure comprises:

a conductive pillar, extending in the first direction and doped with a first type;

a source-region conductive layer, wrapping one end of the conductive pillar, located between the bit line structure and the conductive pillar, and doped with a second type;

a channel-region conductive layer, surrounding the conductive pillar, located between the gate oxide layer and the conductive pillar, and doped with the first type; and a drain-region conductive layer, surrounding the conductive pillar, located between the columnar capacitor structure and the conductive pillar, and doped with the second type.

10. A memory structure, comprising: a substrate; and a plurality of target body structures formed on the substrate, extending in a second direction, and arranged at intervals in a third direction;

wherein, each of the plurality of target body structures comprises a plurality of semiconductor structures arranged at intervals in the second direction, and the semiconductor structures are the semiconductor structure according to claim 1; word line structures in adjacent two of the semiconductor structures in the second direction insulate from each other; and bit line structures in adjacent two of the target body structures in the third direction insulate from each other; and every two of the first direction, the second direction, and the third direction are perpendicular to each other.

11. A method of manufacturing a memory structure, comprising:

providing a substrate; and forming a plurality of target body structures, extending in a second direction and arranged at intervals in a third direction, on the substrate;

wherein, each of the plurality of target body structures comprises a plurality of semiconductor structures arranged at intervals in the second direction, and the semiconductor structures are the semiconductor structure according to claim 1; word line structures in adjacent two of the semiconductor structures in the second direction insulate from each other; and bit line structures in adjacent two of the target body structures in the third direction insulate from each other; and every two of the first direction, the second direction, and the third direction are perpendicular to each other.

12. The method according to claim 11, wherein the forming a plurality of target body structures, extending in a second direction and arranged at intervals in a third direction, on the substrate comprises:

etching an end of the columnar epitaxial structure distant from the bit line structure in the first direction, and forming an interconnection structure, a cross-sectional area of the interconnection structure being less than a cross-sectional area of a part of the columnar epitaxial structure wrapped by the columnar capacitor structure, and a cross section being perpendicular to the first direction; and siliconizing an end of the interconnection structure distant from the bit line structure in the first direction, and forming a conductive contact layer.

13. The method according to claim 12, after the conductive contact layer is formed, the method further comprises:

forming a capacitor isolation structure, the capacitor isolation structure surrounding the columnar epitaxial structure and being located between the conductive contact layer and the columnar capacitor structure; and forming a grounding pad, the grounding pad wrapping the conductive contact layer; wherein, the conductive contact layer and the grounding pad constitute the grounding structure; and two adjacent ones of the grounding structures in the second direction are electrically connected to each other; and two adjacent ones of the grounding structures in the third direction insulate from each other to form the target body structure.

14. The method according to claim 11, wherein the forming a plurality of target body structures, extending in a second direction and arranged at intervals in a third direction, on the substrate further comprises:

sequentially forming a gate oxide layer and a gate metal layer, sequentially stacked from inside to outside, on the columnar epitaxial structure, the gate oxide layer surrounding the columnar epitaxial structure, and the gate metal layer surrounding the gate oxide layer;

wherein, a cross section of a part of the columnar epitaxial structure surrounded by the gate oxide layer is square, with an edge length of [30 nm, 100 nm], and the cross section is perpendicular to the first direction; and/or, an outer boundary of a cross section of the gate oxide layer is square, and the gate oxide layer has a thickness of [4.5 nm, 8 nm]; and/or, an outer boundary of a cross section of the gate metal layer is square, and the gate metal layer has a thickness of [4 nm, 10 nm].

* * * * *